(12) United States Patent
Suto et al.

(10) Patent No.: US 12,685,206 B2
(45) Date of Patent: Jul. 14, 2026

(54) AI BONDING WIRE FOR SEMICONDUCTOR DEVICES

(71) Applicants: NIPPON MICROMETAL CORPORATION, Saitama (JP); NIPPON STEEL Chemical & Material Co., Ltd., Tokyo (JP)

(72) Inventors: Yuya Suto, Tokyo (JP); Tomohiro Uno, Tokyo (JP); Tetsuya Oyamada, Tokyo (JP); Daizo Oda, Saitama (JP); Motoki Eto, Saitama (JP); Yuto Kurihara, Saitama (JP)

(73) Assignees: Nippon Micrometal Corporation, Saitama (JP); NIPPON STEEL Chemical & Material Co., Ltd., Tokyo (JP)

( * ) Notice: Subject to any disclaimer, the term of this patent is extended or adjusted under 35 U.S.C. 154(b) by 458 days.

(21) Appl. No.: 18/275,177

(22) PCT Filed: Jan. 31, 2022

(86) PCT No.: PCT/JP2022/003575
§ 371 (c)(1),
(2) Date: Jul. 31, 2023

(87) PCT Pub. No.: WO2022/168787
PCT Pub. Date: Aug. 11, 2022

(65) Prior Publication Data
US 2024/0071978 A1      Feb. 29, 2024

(30) Foreign Application Priority Data
Feb. 5, 2021      (JP) ................................. 2021-017610

(51) Int. Cl.
B23K 20/00 (2006.01)
B23K 35/00 (2006.01)
(Continued)

(52) U.S. Cl.
CPC ........... *H10W 72/50* (2026.01); *B23K 20/004* (2013.01); *B23K 35/286* (2013.01);
(Continued)

(58) Field of Classification Search
CPC ..................... H01L 24/45; H01L 24/43; H01L 2224/43848; H01L 2224/45015;
(Continued)

(56) References Cited

U.S. PATENT DOCUMENTS

| | | | |
|---|---|---|---|
| 4,845,543 A | 7/1989 | Okikawa et al. | |
| 2011/0011618 A1* | 1/2011 | Uno | H01L 24/43 174/126.1 |

(Continued)

FOREIGN PATENT DOCUMENTS

| | | |
|---|---|---|
| CN | 103276255 A | 9/2013 |
| CN | 103911526 A | 7/2014 |

(Continued)

OTHER PUBLICATIONS

Office Action dated Aug. 29, 2025, from corresponding Taiwanese Application No. 111103889, w/ English Translation (8 pages).

(Continued)

*Primary Examiner* — Kiley S Stoner
(74) *Attorney, Agent, or Firm* — RIMON P.C.

(57) ABSTRACT

To provide an Al bonding wire exhibiting a favorable high-temperature and high-humidity service life in a high-temperature and high-humidity environment required for next-generation vehicle-mounted power devices. The Al bonding wire for semiconductor devices containing equal to or larger than 3 mass ppm and equal to or smaller than 500 mass ppm of one or more of Pd and Pt in total, in which, as a result of measuring a crystal orientation on a cross section parallel to a wire axis direction including a wire axis of the bonding wire, an orientation ratio of a <100> crystal orien- (Continued)

PLANE B (CROSS SECTION PARALLEL TO WIRE AXIS DIRECTION INCLUDING WIRE AXIS

AXIS A (WIRE CENTER AXIS)

tation angled at 15 degrees or less to the wire axis direction is equal to or higher than 30% and equal to or lower than 90%.

9 Claims, 1 Drawing Sheet

(51) Int. Cl.
B23K 35/28 (2006.01)
H10W 72/00 (2026.01)
H10W 72/50 (2026.01)

(52) U.S. Cl.
CPC .... H10W 72/015 (2026.01); H10W 72/01565 (2026.01); H10W 72/5524 (2026.01)

(58) Field of Classification Search
CPC ..... H01L 2224/45124; H01L 2924/207; C22C 21/00; C22F 1/04; B23K 20/004–005; B23K 20/007; B23K 35/0261; B23K 35/286–288
USPC ................ 228/4.5, 180.5, 904; 420/528–554
See application file for complete search history.

(56) References Cited

U.S. PATENT DOCUMENTS

| | | | | |
|---|---|---|---|---|
| 2016/0078980 A1 * | 3/2016 | Sarangapani | ........ | H05K 1/0213 |
| | | | | 174/250 |
| 2016/0111389 A1 | 4/2016 | Yamada et al. | | |
| 2017/0200689 A1 | 7/2017 | Yamada et al. | | |
| 2017/0216974 A1 | 8/2017 | Yamada et al. | | |
| 2018/0130763 A1 | 5/2018 | Yamada et al. | | |
| 2018/0133843 A1 | 5/2018 | Yamada et al. | | |
| 2021/0010110 A1 * | 1/2021 | Kaneko | ..................... | C22F 1/05 |
| 2021/0025033 A1 * | 1/2021 | Kaneko | .................. | C22C 21/00 |
| 2024/0071978 A1 * | 2/2024 | Suto | ......................... | H01L 24/43 |
| 2024/0312946 A1 * | 9/2024 | Oyamada | ................ | C22C 21/00 |

FOREIGN PATENT DOCUMENTS

| | | | | | |
|---|---|---|---|---|---|
| CN | 104164591 A | | 11/2014 | | |
| JP | 60-95948 A | | 5/1985 | | |
| JP | 60-177667 A | | 9/1985 | | |
| JP | S61-032444 A | | 2/1986 | | |
| JP | 2008-311383 A | | 12/2008 | | |
| JP | 2012222194 A | * | 11/2012 | ............. | H01L 24/43 |
| JP | 2014224283 A | * | 12/2014 | ............. | C22C 21/00 |
| JP | WO2015034071 A1 | * | 3/2017 | ............. | H01B 1/026 |
| MY | 162021 A | * | 5/2017 | ................ | C22F 1/14 |
| SG | 10201402300T A | | 12/2014 | | |
| TW | 201620103 A | | 6/2016 | | |
| TW | 201643261 A | | 12/2016 | | |
| WO | 2015/152191 A1 | | 10/2015 | | |
| WO | WO-2022080233 A1 | * | 4/2022 | ............. | B22D 11/06 |

OTHER PUBLICATIONS

Extended European Search Report dated Jan. 30, 2025, from corresponding EP Application No. 22749659.3, 8 pages.
International Search Report issued in corresponding International Patent Application No. PCT/JP2022/003575, dated Mar. 29, 2022, with English translation.
Decision to Grant dated Nov. 12, 2025, from corresponding Singapore Application No. 11202305820R.

* cited by examiner

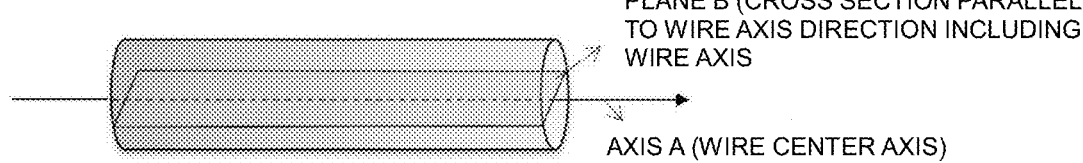
PLANE B (CROSS SECTION PARALLEL
TO WIRE AXIS DIRECTION INCLUDING
WIRE AXIS
AXIS A (WIRE CENTER AXIS)

Al BONDING WIRE FOR SEMICONDUCTOR DEVICES

CROSS-REFERENCE OF RELATED APPLICATIONS

This application is the U.S. National Phase under 35 U.S.C. § 371 of International Patent Application No. PCT/JP2022/003575, filed on Jan. 31, 2022, which in turn claims the benefit of Japanese Patent Application No. 2021-017610, filed on Feb. 5, 2021, the entire disclosures of which Applications are incorporated by reference herein.

TECHNICAL FIELD

The present invention relates to an Al bonding wire for semiconductor devices.

BACKGROUND ART

In power devices mounted on electric vehicles, hybrid vehicles, industrial devices, and the like, a bonding wire is used as a wiring material for electrically connecting semiconductor elements with external substrates. Aluminum (Al) is mainly used as a material for a bonding wire used in power devices due to requirements for excellent bond quality to electrodes on semiconductor elements and external substrates, electrical conductivity, and low cost. For the Al bonding wire, mechanical properties such as a breaking strength and an elongation, a thermal conductivity, and the like are required in accordance with a purpose of use.

In a power device, electrodes formed on a semiconductor chip are connected with a lead frame or electrodes on a substrate via a bonding wire. In the power device, the bonding wire made of aluminum (Al) as a material is mainly used. In a power device using an Al bonding wire, wedge bonding is used as a bonding process for both of first connection with electrodes on a semiconductor chip and second connection with the lead frame or electrodes on a substrate.

When using a material composed only of high-purity Al as the Al bonding wire, corrosion of the Al bonding wire proceeds in a short time in a high-temperature and high-humidity environment at the time when the device operates, and electrical connection is deteriorated, so that it is difficult to use such an Al bonding wire in the high-temperature and high-humidity environment. As a method for prolonging a service life in the high-temperature and high-humidity environment (hereinafter, also referred to as a "high-temperature and high-humidity service life"), there has been developed an Al bonding wire made of a material obtained by adding a specific element to Al. For example, Patent Literature 1 discloses a bonding wire in which 0.001 to 0.08% of one or more of Pd and Pt is added to Al. Patent Literature 2 discloses a bonding wire in which 10 to 200 mass ppm of one or more of Rh and Pd in total is added. It is disclosed that these bonding wires exhibit a favorable high-temperature and high-humidity service life in an accelerated evaluation test, what is called a Pressure Cooker Test (PCT), under the condition with a temperature of 121° C. and a relative humidity of 100%.

As for the heat treatment conditions during the production of the Al bonding wire, Patent Literature 1 does not disclose any heat treatment conditions, and Patent Literature 2 discloses that heat treatment should be performed as needed with a wire diameter before reaching a final wire diameter, and heat treatment should be performed for 1 hour in a temperature range of 200 to 300° C. with the final wire diameter.

RELATED ART REFERENCE

Patent Literature

Patent Literature 1: JP-A-S61-032444
Patent Literature 2: JP-A-2014-224283

SUMMARY OF INVENTION

Problem to be Solved by the Invention

A bonding wire used for power devices is required to achieve a favorable high-temperature and high-humidity service life while satisfying basic characteristics such as wedge bondability, electrical conductivity, heat resistance, and the like.

In recent years, for an Al bonding wire used for leading-edge power devices, a requirement for a high-temperature and high-humidity service life becomes severer. Particularly, for an Al bonding wire used for next-generation vehicle-mounted power devices, a requirement for improving a high-temperature and high-humidity service life is expected in an accelerated evaluation test, what is called a Highly Accelerated Stress Test (HAST), under an accelerated evaluation condition with a temperature of 150° C. and 85% RH (relative humidity), which takes into account an operation in a higher-temperature environment. The requirement for the high-temperature and high-humidity service life in the future becomes higher as described above, so that the present inventors have executed an unbiased-HAST (hereinafter, also referred to as a uHAST) test in which a bias voltage is not applied to a bonded part under the accelerated evaluation condition with a temperature of 150° C. and 85% RH. For example, in a case of using an Al bonding wire constituted of Al having a purity equal to or higher than 99.99% by mass, the high-temperature and high-humidity service life is significantly lowered in less than 2000 hours, and performance required for next-generation vehicle-mounted power devices could not be achieved. This is because corrosion of the entire bonding wire proceeds, and an Al oxide and an Al hydroxide, which have higher electric resistance than that of Al, are generated as corrosion products, so that electric resistance of the bonding wire is increased. A test temperature of the uHAST is higher than that of the PCT and a forming speed of the corrosion products described above is accelerated, and the high-temperature and high-humidity service life in the uHAST is required to be two or more times the service life in the PCT, so that a requirement for improving the high-temperature and high-humidity service life is expected in the uHAST, which takes into account an operation in a higher-temperature environment.

It is difficult to improve the high-temperature and high-humidity service life in the uHAST by only an effect of an additive element. For example, even the Al bonding wire containing one or more noble metal elements disclosed in Patent Literatures 1 and 2 described above does not have a sufficient high-temperature and high-humidity service life in the uHAST, and a sufficient high-temperature and high-humidity service life required for next-generation vehicle-mounted power devices could not be obtained.

An object of the present invention is to provide an Al bonding wire exhibiting a favorable high-temperature and high-humidity service life in a high-temperature and high-humidity environment, which is required for next-generation vehicle-mounted power devices.

Means for Solving Problem

As a result of earnest investigation as to the problem described above, the present inventors have found that the problems described above can be solved by the Al bonding wire containing equal to or larger than 3 mass ppm and equal to or smaller than 500 mass ppm of one or more of Pd and Pt in total, wherein, on a cross-section parallel to a wire axis direction thereof, an orientation ratio of <100> crystal orientation angled at 15 degrees or less to the wire axis direction falls within a specific range, and further performed investigation based on such knowledge to complete the present invention.

That is, the summary of the present invention is as follows.

[1] An Al bonding wire for semiconductor devices containing equal to or larger than 3 mass ppm and equal to or smaller than 500 mass ppm of one or more of Pd and Pt in total, wherein, as a result of measuring a crystal orientation on a cross-section parallel to a wire axis direction including a wire axis of the bonding wire, an orientation ratio of a <100> crystal orientation angled at 15 degrees or less to the wire axis direction is equal to or higher than 30% and equal to or lower than 90%.

[2] The Al bonding wire for semiconductor devices according to [1], wherein a tensile strength is equal to or larger than 25 MPa and equal to or smaller than 85 MPa.

[3] The Al bonding wire for semiconductor devices according to [1] or [2], further containing equal to or larger than 3 mass ppm and equal to or smaller than 10000 mass ppm of one or more of Si, Au, and Ag in total.

[4] The Al bonding wire for semiconductor devices according to any one of [1] to [3], further containing equal to or larger than 3 mass ppm and equal to or smaller than 700 mass ppm of one or more of Fe and Mg in total.

[5] The Al bonding wire for semiconductor devices according to any one of [1] to [4], wherein a content of Al is equal to or larger than 98% by mass.

[6] The Al bonding wire for semiconductor devices according to any one of [1] to [5], wherein a balance of the Al bonding wire comprises Al and inevitable impurities.

[7] A semiconductor device comprising the Al bonding wire for semiconductor devices according to any one of [1] to [6].

Effect of the Invention

The present invention can provide an Al bonding wire exhibiting a favorable high-temperature and high-humidity service life in a high-temperature and high-humidity environment, which is required for next-generation vehicle-mounted power devices.

The present invention can further improve characteristics such as loop straightness at the time of forming a long-span loop, a shear force of a wedge bonded part, and the like.

BRIEF DESCRIPTION OF DRAWINGS

FIG. 1 is a schematic diagram for explaining a measurement target surface (inspection surface) at the time of measuring an orientation ratio of a <100> crystal orientation for an Al bonding wire.

EMBODIMENT FOR CARRYING OUT THE INVENTION

Hereinafter, the present invention will be described in detail with reference to a preferable embodiment thereof. However, the present invention is not limited to the following embodiment and examples, and may be optionally changed to be implemented without departing from CLAIMS of the present invention and equivalents thereof.
[Al Bonding Wire for Semiconductor Devices]

An Al bonding wire for semiconductor devices according to the present invention is an Al bonding wire for semiconductor devices containing equal to or larger than 3 mass ppm and equal to or smaller than 500 mass ppm of one or more of Pd and Pt in total, and is characterized in that, as a result of measuring a crystal orientation of a cross-section including a wire axis of the bonding wire and being parallel to a wire axis direction, an orientation ratio of a <100> crystal orientation angled at 15 degrees or less to the wire axis direction is equal to or higher than 30% and equal to or lower than 90%.

As described above, for the Al bonding wire used for leading-edge power devices, especially for next-generation vehicle-mounted power devices, a requirement for improving a high-temperature and high-humidity service life is expected in an accelerated evaluation test, what is called a uHAST, under an accelerated evaluation condition with a temperature of 150° C. and 85% RH, which takes into account an operation in a higher-temperature environment. It has been difficult to improve the high-temperature and high-humidity service life in the uHAST by only an effect of an additive element. It has been found that the service life of the Al bonding wire is more strongly influenced by a temperature in a high-humidity environment. For example, although there is known a PCT with a temperature of 121° C. and 100% RH as the accelerated evaluation test in a high-temperature environment, even the Al bonding wire containing one or more noble metal elements that is assumed to exhibit a favorable high-temperature and high-humidity service life in the PCT does not exhibit a sufficient high-temperature and high-humidity service life in the uHAST that is executed in a higher-temperature environment than the PCT in some cases.

On the other hand, the present inventors have found that the following Al bonding wire exhibits a favorable high-temperature and high-humidity service life also in the uHAST, specifically, the following Al bonding wire can suppress corrosion of the wire and maintain favorable electrical connection even after 2000 hours elapses in the uHAST. Such Al bonding wire contains equal to or larger than 3 mass ppm and equal to or smaller than 500 mass ppm of one or more of Pd and Pt in total, as well as the orientation ratio of the <100> crystal orientation angled at 15 degrees or less to the wire axis direction is equal to or higher than 30% and equal to or lower than 90% on a cross-section parallel to the wire axis direction including the wire axis. It has been confirmed that, regarding a synergistic effect of control of the orientation ratio of the <100> crystal orientation and addition of elements including Pd and Pt, an effect of suppressing corrosion becomes higher as the temperature is increased. For example, control of the crystal orientation is effective to suppress corrosion in an environment exceeding 140° C. Furthermore, the effect described above is sufficiently exhibited not only in an unbiased-HAST in which a bias voltage is not applied to a wedge bonded part but also in a biased-HAST in which a bias voltage is applied to the bonded part. Herein, the wire axis means an axis passing through the center of the wire and parallel with a wire longitudinal direction. In this way, the Al bonding wire for semiconductor devices according to the present invention (hereinafter, also simply referred to as a "bonding wire" or a "wire") can exhibit a favorable high-temperature and high-humidity service life even in a high-temperature and high-humidity environment required for leading-edge power devices, especially for next-generation vehicle-mounted power devices, and greatly contributes to improvement in high-temperature and high-humidity resistance of the power devices.

The reason why the bonding wire according to the present invention can exhibit a favorable high-temperature and high-humidity service life in the uHAST is estimated as follows. First, as a cause of deterioration of the high-temperature and high-humidity service life, it can be considered that an Al oxide and Al hydroxide are formed to cause corrosion on a bonding wire surface under a high-temperature and high-humidity environment. It can be estimated that the Al oxide and the Al hydroxide are formed due to a chemical reaction between Al and $H_2O$. Although a detailed mechanism is unknown, it can be estimated that the bonding wire according to the present invention can suppress corrosion in the uHAST because of a synergistic effect between a predetermined amount of one or more of Pd and Pt contained in the bonding wire and the ratio of the <100> crystal orientation of Al on the cross-section parallel to the wire axis direction set to be a predetermined orientation.

From the viewpoint of obtaining a favorable high-temperature and high-humidity service life, a total concentration of one or more of Pd and Pt in the bonding wire of the present invention is equal to or larger than 3 mass ppm, more preferably equal to or larger than 5 mass ppm, and even more preferably equal to or larger than 10 mass ppm, equal to or larger than 12 mass ppm, equal to or larger than 14 mass ppm, equal to or larger than 15 mass ppm, equal to or larger than 16 mass ppm, equal to or larger than 18 mass ppm, or equal to or larger than 20 mass ppm. In a case of adding Pd and Pt in combination, a more favorable high-temperature and high-humidity service life can be obtained as compared with a case of solely adding Pd or Pt. On the other hand, when a content of Pd and Pt is excessive, conditions of ultrasonic waves and a load for obtaining a favorable bonding state tends to be narrowed (hereinafter, also referred to as "wedge bondability is lowered"). This may be because, when the content of Pd and Pt is excessive, the wire becomes excessively hard, and a wire deformation amount at the time of wedge bonding becomes insufficient under the condition of ultrasonic waves and a load that is typically used. A requirement for wedge bondability is difficult to be satisfied by next-generation vehicle-mounted power devices. This is because wedge bondability required for conventional power devices cannot satisfy basic characteristics such as heat resistance required for next-generation vehicle-mounted power devices in some cases. Accordingly, the total concentration of one or more of Pd and Pt is equal to or smaller than 500 mass ppm, preferably smaller than 500 mass ppm or equal to or smaller than 450 mass ppm, and more preferably equal to or smaller than 400 mass ppm, equal to or smaller than 350 mass ppm, equal to or smaller than 300 mass ppm, equal to or smaller than 250 mass ppm, or equal to or smaller than 200 mass ppm.

For concentration analysis of elements contained in the bonding wire, an Inductively Coupled Plasma (ICP) emission spectroscopic analysis device or an ICP mass spectroscopic device can be used. In a case where elements derived from contaminants from the atmosphere such as oxygen or carbon are adsorbed by a surface of the bonding wire, it is effective to clean the surface by acid or alkali before analysis is performed.

From the viewpoint of obtaining a favorable high-temperature and high-humidity service life, as a result of measuring the crystal orientation on the cross-section parallel to the wire axis direction including the wire axis of the bonding wire, the orientation ratio of the <100> crystal orientation angled at 15 degrees or less to the wire axis direction is equal to or higher than 30%, preferably equal to or higher than 40%, more preferably equal to or higher than 50%, and even more preferably equal to or higher than 55% or equal to or higher than 60%. When the orientation ratio of the <100> crystal orientation is lower than 30%, a sufficient high-temperature and high-humidity service life tends not to be obtained in the uHAST. This may be because, when the orientation ratio of the <100> crystal orientation is low, an effect of reducing corrosion susceptibility due to a chemical reaction between Al and $H_2O$ could not be sufficiently obtained. On the other hand, it has been found that wedge bondability tends to be lowered when the orientation ratio of the <100> crystal orientation is too high. This may be because, when the orientation ratio of the <100> crystal orientation is too high, a wire deformation amount at the time of wedge bonding becomes insufficient. Accordingly, the orientation ratio of the <100> crystal orientation is equal to or lower than 90%, preferably lower than 90% or equal to or lower than 88%, and more preferably equal to or lower than 86%, equal to or lower than 85%, equal to or lower than 84%, equal to or lower than 82%, or equal to or lower than 80%.

The following describes a method for measuring the crystal orientation on the cross-section parallel to the wire axis direction including the wire axis of the bonding wire according to the present invention. As the method for measuring the crystal orientation, an Electron BackScattered Diffraction (EBSD) method can be used. A device used for the EBSD method is configured by a scanning electron microscope and a detector mounted thereon. The EBSD method is a method for determining the crystal orientation at each measurement point by projecting, on the detector, a diffraction pattern of a reflected electron that is generated when an electron beam is emitted to a sample, and analyzing the diffraction pattern. For analysis of data obtained by the EBSD method, dedicated software (OIM analysis and the like manufactured by TSL solutions) can be used. The orientation ratio of a specific crystal orientation can be calculated by using analysis software attached to the device assuming that the cross-section parallel to the wire axis direction including the wire axis (cross-section parallel to the bonding wire longitudinal direction) is the inspection surface. In the present invention, the wire axis of the bonding wire and the cross-section parallel to the wire axis direction including the wire axis will be described later with reference to FIG. 1 in a column of "(Measurement of orientation ratio of <100> crystal orientation)".

In the present invention, the orientation ratio of the <100> crystal orientation is defined as an area ratio of the <100> crystal orientation assuming that a measurement area is a population. In calculating the orientation ratio, the orientation ratio of the <100> crystal orientation is assumed to be an area ratio of the <100> crystal orientation that is calculated assuming that an area of only the crystal orientation identified based on certain reliability is a population in a measurement area. In a process of obtaining the orientation ratio, calculation was performed excluding a part in which the crystal orientation cannot be measured, a part in which the crystal orientation can be measured but reliability of orientation analysis is low, or the like.

In the present invention, the orientation ratio of the <100> crystal orientation was assumed to be an arithmetic mean of values of the orientation ratios obtained by measuring five or more points. In selecting a measurement region, from the viewpoint of securing objectivity of measurement data, it is preferable to acquire, from the bonding wire as a measurement target, a sample for measurement at intervals of 1 m or more with respect to the wire axis direction to be measured. In the present invention, the measurement region for the crystal orientation by the EBSD method had a length equal to or larger than 300 μm and smaller than 600 μm in the wire axis direction, and had a length larger than the entire wire in a direction perpendicular to the wire axis direction.

Tensile Strength of Wire

The bonding wire used for power devices is required to exhibit favorable loop straightness when a long-span loop is formed. For example, in a case of using an Al bonding wire made of Al having a purity equal to or higher than 99.99% by mass as a raw material, the wire is bent in a vertical direction with respect to a straight line connecting wire bonded parts, that is, a first bonded part with respect to an electrode on a semiconductor chip and a second bonded part with respect to an electrode on a lead frame or a substrate at the time of forming a long-span loop, and required performance was not be able to be achieved.

In a process of investigating the Al bonding wire containing equal to or larger than 3 mass ppm and equal to or smaller than 500 mass ppm of one or more of Pd and Pt in total in which, on the cross-section parallel to the wire axis direction including the wire axis, the orientation ratio of the <100> crystal orientation angled at 15 degrees or less to the wire axis direction is equal to or higher than 30% and equal to or lower than 90%, the present inventors have further found that the loop straightness at the time of forming the long-span loop is improved when the tensile strength of the wire is equal to or larger than 25 MPa and equal to or smaller than 85 MPa.

The reason why the loop straightness at the time of forming the long-span loop is improved when the tensile strength of the bonding wire of the present invention is equal to or larger than 25 MPa and equal to or smaller than 85 MPa is estimated as follows. That is, the reason is estimated such that, an effect of increasing a yield stress in the wire axis direction is exhibited due to the predetermined amount of one or more of Pd and Pt contained in the wire, an effect of reducing variation in a mechanical strength in the wire axis direction is exhibited by controlling the orientation ratio of the <100> crystal orientation on the cross-section parallel to the wire axis direction to fall within a predetermined range, and an effect of increasing a yield stress in the wire axis direction is exhibited by controlling the tensile strength of the wire to fall within a predetermined range, and a synergistic effect of these effects is caused.

From the viewpoint of improving the loop straightness at the time of forming the long-span loop, the tensile strength of the bonding wire of the present invention is preferably equal to or larger than 25 MPa, more preferably equal to or larger than 26 MPa or equal to or larger than 28 MPa, and even more preferably equal to or larger than 30 MPa, equal to or larger than 32 MPa, equal to or larger than 34 MPa, equal to or larger than 36 MPa, equal to or larger than 38 MPa, or equal to or larger than 40 MPa. When the tensile strength of the bonding wire of the present invention is smaller than 25 MPa, the loop straightness at the time of forming the long-span loop tends not to be sufficiently obtained. This may be because the wire becomes excessively soft. On the other hand, when the tensile strength of the wire is too high, wedge bondability tends to be lowered. This may be because the wire becomes excessively hard, and a wire deformation amount at the time of wedge bonding becomes insufficient. Accordingly, the tensile strength of the wire is preferably equal to or smaller than 85 MPa, more preferably equal to or smaller than 84 MPa, equal to or smaller than 82 MPa, equal to or smaller than 80 MPa, equal to or smaller than 78 MPa, equal to or smaller than 76 MPa, or equal to or smaller than 75 MPa.

The tensile strength of the bonding wire can be measured by using a tensile test. A commercially available tensile testing machine (TENSILON RTF-1225 manufactured by A&D Company, Limited) can be used for the tensile test. Measurement can be performed assuming that a distance between gauge points is 100 mm, a tensile speed is 10 mm/min, and a load cell rating load is 250 N. In the present invention, the tensile strength means a maximum stress in the tensile test.

Si, Au, Ag

The bonding wire of the present invention may further contain equal to or larger than 3 mass ppm and equal to or smaller than 10000 mass ppm of one or more of Si, Au, and Ag in total. Due to this, a further favorable high-temperature and high-humidity service life can be achieved.

As the reason why the high-temperature and high-humidity service life is further improved when the bonding wire of the present invention further contains equal to or larger than 3 mass ppm and equal to or smaller than 10000 mass ppm of one or more of Si, Au, and Ag in total, it can be considered that a catalytic action is exerted by adding one or more of Si, Au, and Ag under presence of Pd and Pt, that is, adding Pd and Pt in combination with one or more of Si, Au, and Ag.

From the viewpoint of achieving a further favorable high-temperature and high-humidity service life, a total concentration of one or more of Si, Au, and Ag contained in the bonding wire of the present invention is preferably equal to or larger than 3 mass ppm, more preferably equal to or larger than 5 mass ppm, and even more preferably equal to or larger than 6 mass ppm, equal to or larger than 8 mass ppm, equal to or larger than 10 mass ppm, equal to or larger than 12 mass ppm, equal to or larger than 14 mass ppm, or equal to or larger than 15 mass ppm. The total concentration of one or more of Si, Au, and Ag is preferably equal to or smaller than 1000 mass ppm, and more preferably smaller than 1000 mass ppm, equal to or smaller than 950 mass ppm, equal to or smaller than 900 mass ppm, equal to or smaller than 850 mass ppm, equal to or smaller than 800 mass ppm, equal to or smaller than 750 mass ppm, equal to or smaller than 700 mass ppm, equal to or smaller than 650 mass ppm, or equal to or smaller than 600 mass ppm. It has been found that, when the bonding wire of the present invention further contains one or more of Si, Au, and Ag in the preferred range described above, corrosion of the wire can be suppressed and favorable electrical connection can be maintained even after 3000 hours elapses in the uHAST.

Fe, Mg

The bonding wire of the present invention may further contain equal to or larger than 3 mass ppm and equal to or smaller than 700 mass ppm of one or more of Fe and Mg in total. Due to this, the shear force of the wedge bonded part can be further improved.

It is estimated that the reason why the shear force of the wedge bonded part is improved when the bonding wire of the present invention further contains a predetermined amount of one or more of Fe and Mg is mainly because a yield stress in the wire axis direction is increased due to solid-solution strengthening.

From the viewpoint of improving the shear force of the wedge bonded part, a total concentration of one or more of Fe and Mg contained in the bonding wire of the present invention is preferably equal to or larger than 3 mass ppm, more preferably equal to or larger than 5 mass ppm, and even more preferably equal to or larger than 6 mass ppm, equal to or larger than 8 mass ppm, equal to or larger than 10 mass ppm, equal to or larger than 12 mass ppm, equal to or larger than 14 mass ppm, or equal to or larger than 15 mass ppm. Additionally, the total concentration of one or more of Fe and Mg is preferably equal to or smaller than 700 mass ppm, and more preferably smaller than 700 mass ppm, equal to or smaller than 650 mass ppm, equal to or smaller than 600 mass ppm, equal to or smaller than 550 mass ppm, equal to or smaller than 500 mass ppm, equal to or smaller than 450 mass ppm, or equal to or smaller than 400 mass ppm.

The balance, the remaining part, of the bonding wire of the present invention contains Al. As an aluminum raw material for manufacturing the bonding wire, Al having a purity of 4N (Al: 99.99% by mass or more) can be used. More preferably, Al having a purity equal to or higher than 5N (Al: 99.999% by mass or more) the amount of impurities of which is smaller is used. In a range of not inhibiting the effect of the present invention, the balance of the bonding wire of the present invention may contain an element other than Al. The content of Al in the bonding wire of the present invention is not limited so long as the content does not inhibit the effect of the present invention, and is preferably equal to or larger than 95% by mass, equal to or larger than 96% by mass, or equal to or larger than 97% by mass, and more preferably equal to or larger than 98% by mass, equal to or larger than 98.5% by mass, equal to or larger than 98.6% by mass, equal to or larger than 98.8% by mass, or equal to or larger than 99% by mass. According to the preferred embodiment, the balance of the bonding wire of the present invention consists of Al and inevitable impurities.

In the preferred embodiment, the bonding wire of the present invention does not have a coating that contains a metal other than Al as a main component on the outer periphery of the wire. Herein, the "coating that contains a metal other than Al as a main component" means the coating in which the content of the metal other than Al is 50% by mass or more.

The bonding wire of the present invention can achieve a favorable high-temperature and high-humidity service life in a high-temperature and high-humidity environment required for next-generation vehicle-mounted power devices while satisfying basic characteristics such as wedge bondability, electrical conductivity, heat resistance, and the like. Thus, the bonding wire of the present invention can be preferably used as an Al bonding wire for semiconductor devices, especially for power semiconductor devices (particularly, for vehicle-mounted power semiconductor devices).

A wire diameter of the bonding wire of the present invention is not particularly limited, and may be 50 to 600 μm, for example.

(Method for Manufacturing Bonding Wire)

A manufacturing method for the Al wiring material of the present invention is not particularly limited. For example, the Al wiring material of the present invention may be manufactured by using a known processing method such as extrusion processing, swaging processing, wire-drawing processing, and rolling processing, for example. When the wire diameter is small to some extent, it is preferable that wire-drawing processing with diamond dies be performed. With regard to the cold working in which the wire-drawing is performed at an ordinary temperature, a production device and the like therefor have a relatively simple configuration and a workability thereof is excellent. When the resistance during wire-drawing is decreased so as to increase the productivity, there may be used the hot working in which the wire-drawing is performed while heating.

After weighing pure metals of Al and additive elements as starting materials so that the content of each additive element falls within a specific range, these materials are mixed and then molten and solidified to form an ingot. Alternatively, as the raw material for each additive element, a mother alloy containing the additive element in high concentration may be used. In the process of melting for producing the ingot, a batch process or a continuous casting process can be used. A diameter of the cylindrical ingot is preferably equal to or smaller than φ8 mm (for example, equal to or larger than φ3 mm and equal to or smaller than 8 mm) while taking into account workability in the following processing step.

Wire-drawing processing and the like can be performed on the obtained cylindrical ingot to manufacture the wire having a predetermined wire diameter. A thermal refining heat treatment is preferably performed with the wire diameter before reaching the final wire diameter (hereinafter, referred to as an "intermediate wire diameter") or at the final wire diameter. By performing the thermal refining heat treatment, processing strain can be removed, or recrystallization and the like can be caused. A condition for the thermal refining heat treatment is, for example, heating at a temperature range equal to or higher than 300° C. and equal to or lower than 600° C. for a time equal to or longer than 1 second and shorter than 600 seconds.

As a result of measuring the crystal orientation on the cross-section parallel to the wire axis direction including the wire axis of the bonding wire, to control the orientation ratio of the <100> crystal orientation angled at 15 degrees or less to the wire axis direction to be equal to or higher than 30% and equal to or lower than 90%, for example, it is effective to perform heat treatment with an intermediate wire diameter (hereinafter, also referred to as "intermediate heat treatment").

For the intermediate heat treatment, a method of continuously sweeping the wire can be used. In a case of using this method, it is effective to perform the intermediate heat treatment multiple times with the intermediate wire diameter at a temperature range equal to or higher than 300° C. and equal to or lower than 550° C. It is effective to set a heat treatment time at the time of the intermediate heat treatment to be equal to or longer than 1 second and shorter than 600 seconds. It is effective to perform the intermediate heat treatment once with a wire diameter of 1.3 to 2.0 times the final wire diameter, and once with a wire diameter of 2.3 to 4.0 times the final wire diameter. An atmosphere of the heat treatment is preferably caused to be an inert atmosphere such as an Ar gas atmosphere to prevent oxidation.

The following describes the reason why the method described above is effective to control the orientation ratio of the <100> crystal orientation described above to be equal to or higher than 30% and equal to or lower than 90%. A crystal grain having the <100> crystal orientation described above is formed when recrystallization is caused in the intermediate heat treatment or the heat treatment step with the final wire diameter. Thus, it is important to control growth of the crystal grain by performing the intermediate heat treatment step with a predetermined wire diameter. Herein, the crystal grain grows using, as driving force, strain energy accumulated in a material due to wire-drawing processing, so that it is important to control growth of the crystal grain by performing the intermediate heat treatment with the predetermined wire diameter. A growth rate of the crystal grain is increased as a heat treatment temperature is increased, so that it is important to control the heat treatment temperature or the heat treatment time. According to the present invention, it can be considered that growth of the crystal grain can be controlled by performing the intermediate heat treatment step with the predetermined wire diameter, heat treatment temperature, and heat treatment time, and the orientation ratio of the <100> crystal orientation of the wire manufactured through the final heat treatment step can be controlled to be in a desired range.

[Semiconductor Device]

The semiconductor device can be manufactured by connecting the electrode on the semiconductor chip to an external electrode on a lead frame or a substrate by using the bonding wire of the present invention.

In one embodiment, the semiconductor device of the present invention includes the circuit board, the semiconductor chip, and the bonding wire for bringing the circuit board and the semiconductor chip into conduction with each other, and is characterized in that the bonding wire is the bonding wire of the present invention.

In the semiconductor device of the present invention, the circuit board and the semiconductor chip are not particularly limited, and a known circuit board and semiconductor chip that may be used for constituting the semiconductor device may be used. Alternatively, a lead frame may be used in place of the circuit board. For example, like the semiconductor device disclosed in JP-A-2002-246542, the semiconductor device may include a lead frame and a semiconductor chip mounted on the lead frame.

Examples of the semiconductor device include various semiconductor devices used for electric products (for example, a computer, a cellular telephone, a digital camera, a television, an air conditioner, a solar power generation system), vehicles (for example, a motorcycle, an automobile, an electric train, a ship, and an aircraft), and the like, a semiconductor device for electric power (power semiconductor device) is especially preferred, and a vehicle-mounted power semiconductor device is particularly preferred.

EXAMPLE

Hereinafter, the present invention will be described in detail with reference to Examples. However, the present invention is not limited to the following Examples.

(Sample)

A method for manufacturing a sample will be described. As a raw material, Al having a purity of 4N (99.99% by mass or more) and including inevitable impurities as a balance was used. Pd, Pt, Si, Au, Ag, Fe, and Mg each having a purity of 99.9% by mass or more and including inevitable impurities as a balance were also used. An Al alloy used for the bonding wire was manufactured by loading an alumina crucible having an inner diameter equal to or larger than mm and smaller than 70 mm with a raw material to be alloyed with the Al raw material, and melting it by using a high-frequency melting furnace. An atmosphere in the furnace at the time of melting was caused to be an Ar atmosphere, the highest end-point temperature at the time of melting was caused to fall within a range equal to or higher than 1050° C. and lower than 1300° C. In the process of melting for producing the ingot, a batch-type high-frequency melting furnace was used. Cooling after the melting was air cooling. In a case where an organic matter or the like was attached to a surface of the ingot after the melting, polishing, degreasing, or pickling was performed as needed.

The cylindrical ingot having a diameter equal to or larger than φ3 mm and equal to or smaller than 8 mm was obtained by melting, and wire-drawing processing and the like were performed on the ingot using dies to prepare the wire having a diameter of φ300 μm. At the time of wire-drawing processing, a commercially available lubricating liquid was used for securing lubricity on a contact interface between the wire and the dies. A reduction of area per die at the time of wire-drawing processing was equal to or higher than 10% and lower than 15%. Herein, the reduction of area is a value representing, as a percentage, a ratio of a cross-sectional area of the wire that is reduced by the wire-drawing processing to the cross-sectional area of the wire before performing the wire-drawing processing. A wire feeding speed at the time of wire-drawing processing was set to be equal to or higher than 10 m/min and lower than 300 m/min. The intermediate heat treatment with the intermediate wire diameter and the final heat treatment with the final wire diameter were performed under the conditions described later.

The intermediate heat treatment was performed while continuously sweeping the wire. The atmosphere at the time of intermediate heat treatment was caused to be an Ar gas atmosphere. In the intermediate heat treatment, the heat treatment temperature was set to be equal to or higher than 300° C. and equal to or lower than 550° C., and the heat treatment time was set to be equal to or longer than 1 second and shorter than 600 seconds. The intermediate heat treatment was performed once with a wire diameter of 1.3 to 2.0 times the final wire diameter, and performed once with a wire diameter of 2.3 to 4.0 times the final wire diameter.

The wire after the wire-drawing processing was subjected to the final heat treatment so that the tensile strength finally becomes equal to or larger than 25 MPa and equal to or smaller than 85 MPa, and a breaking elongation becomes equal to or higher than 15% and lower than 25%. The final heat treatment was performed while continuously sweeping the wire. The atmosphere at the time of final heat treatment was caused to be the Ar gas atmosphere. In the final heat treatment, the heat treatment temperature was set to be equal to or higher than 400° C. and equal to or lower than 600° C., and the heat treatment time was set to be equal to or longer than 1 second and shorter than 600 seconds.

In manufacturing the wire according to Comparative Examples 7 to 11, the intermediate heat treatment temperature was set to be 250° C., and the heat treatment time was set to be 5 seconds. The intermediate heat treatment was performed once with a wire diameter of 500 μm, and performed once with a wire diameter of 900 μm. The final heat treatment temperature was set to be lower than 400° C., and the heat treatment time was set to be shorter than 1 second. In manufacturing the wire according to Comparative Example 12, the intermediate heat treatment temperature was set to be 350° C., and the heat treatment time was set to be 8 seconds. The intermediate heat treatment was performed once with a wire diameter of 450 μm, and performed once with a wire diameter of 1100 μm. The final heat treatment temperature was set to be 450° C., and the heat treatment time was set to be 4 seconds. Furthermore, in manufacturing the wire according to Examples 39 to 44, the intermediate heat treatment temperature was set to be 570° C., and the heat treatment time was set to be 400 seconds. The intermediate heat treatment was performed once with a wire diameter of 600 μm, and performed once with a wire diameter of 1000 μm. The final heat treatment temperature was set to be equal to or higher than 600° C., and the heat treatment time was set to be equal to or longer than 600 seconds.

(Measurement of Element Content)

The content of elements in the bonding wire was measured by using ICP-OES ("PS3520UVDDII" manufactured by Hitachi High-Tech Corporation) or ICP-MS ("Agilent 7700x ICP-MS" manufactured by Agilent Technologies, Inc.) as an analysis device.

(Measurement of Orientation Ratio of <100> Crystal Orientation)

The orientation ratio of the <100> crystal orientation was measured by using, as an inspection surface, the cross-section parallel to the wire axis including the wire axis of the bonding wire. In the present invention, the wire axis means an axis A illustrated in FIG. 1, that is, a center axis of the bonding wire. Additionally, the cross-section parallel to the wire axis direction means a plane B illustrated in FIG. 1, that is, a cross-section parallel to the wire axis direction (wire longitudinal direction) including the center axis of the bonding wire. A value of the orientation ratio of the <100> crystal orientation was assumed to be an arithmetic mean of values obtained in five measurement regions. For the bonding wire as a measurement target, samples for measurement were acquired at intervals of 1 m or more with respect to the wire axis direction to be measured. The measurement region had a length equal to or larger than 300 μm and smaller than 600 μm in the wire axis direction, and had a length larger than the entire wire in a direction perpendicular to the wire axis direction. As a method for measuring the crystal orientation, the EBSD method was used. For analysis of data obtained by the EBSD method, dedicated software (OIM analysis and the like manufactured by TSL solutions) was used. Measurement results are indicated in a column of "orientation ratio of <100> crystal orientation" in Table 1-1, Table 1-2, Table 1-3, Table 1-4, and Table 2-1.

(Measurement of Tensile Strength)

The tensile strength of the bonding wire was measured by using a tensile test. A commercially available tensile testing machine (TENSILON RTF-1225 manufactured by A&D Company, Limited) was used for the tensile test, and measurement was performed under conditions of a distance between gauge points of 100 mm, a tensile speed of 10 mm/min, and a load cell rating load of 250 N. A maximum stress in the tensile test was assumed to be the tensile strength. Arithmetic mean values of the tensile strength of 10 bonding wires are indicated in a column of "tensile strength" in Table 1-1, Table 1-2, Table 1-3, Table 1-4, and Table 2-1.

(Method for Evaluating Bonding Wire)

The following describes a method for evaluating the bonding wire. The wire diameter of the bonding wire used for evaluation was set to be 000 μm. As a substrate, a Ni-plated Al substrate was used. For bonding of the bonding wire, a commercially available wire bonder (REBO-7 manufactured by Ultrasonic Engineering Co., Ltd.) was used. The temperature at the time of bonding was set to be an ordinary temperature, and the atmosphere at the time of bonding was set to be an air atmosphere.

(Method for Evaluating High-Temperature and High-Humidity Service Life)

The following describes a method for evaluating the high-temperature and high-humidity service life. The high-temperature and high-humidity service life was evaluated by the uHAST as the accelerated evaluation test under a high-temperature and high-humidity environment. Conditions for the uHAST were set to be 85% RH and 150° C., which is higher than a typical temperature, while taking into account an operation in a higher-temperature environment.

Under typical bonding conditions for the Al wire, five wires were wedge-bonded onto the substrate. Subsequently, the prepared sample was allowed to stand in a high-temperature and high-humidity furnace. Conditions for the uHAST were set to be 150° C. and 85% RH, and the atmosphere inside the high-temperature and high-humidity furnace was set to be an air atmosphere. Regarding the sample after the uHAST ended, a cross-section of a wire loop portion parallel to the wire axis direction including the wire axis was exposed by mechanical polishing to check whether corrosion was caused in the wire. To check whether corrosion was caused, a Scanning Electron Microscope (SEM) was used. A visual field to be observed was set to be 99% or more of the wire diameter, with the length in the wire axis direction equal to or larger than 1 mm. A point where to check whether corrosion was caused was set to be the entire visual field to be observed. After 2000 hours elapsed, the entire cross-sections of five wires were observed with 200-fold magnification. In a case where an area ratio of corrosion of at least one wire was equal to or higher than 10%, it was determined that there was a practical problem and evaluated as "cross". In a case where the area ratios of corrosion of the five wires were lower than 10%, it was determined that there was no practical problem and evaluated as "circle". Herein, the area ratio is a value calculated by dividing a corroded region in the observed visual field by the cross-sectional area of the wire. Furthermore, in a case where the area ratios of corrosion of the five wires were all lower than 10% at the time when 3000 hours elapsed, it was determined to be excellent and evaluated as "double circle". Evaluation results are indicated in a column of "high-temperature and high-humidity service life" in Table 1-1, Table 1-2, Table 1-3, Table 1-4, and Table 2-1. "cross" means "failure", and "circle" and "double circle" mean "passed".

(Method for Evaluating Loop Straightness at Time of Forming Long-Span Loop)

The following describes a method for evaluating loop straightness at the time of forming a long-span loop. As conditions for forming a loop, a distance between the wire bonded parts was set to be 30.0 mm and a loop height was set to be 6 mm, which are conditions severer than normal loop forming conditions, while taking into account a long-span loop. Assuming that the distance between the wire bonded parts is a, and a length of a line passing through the wire axis at the time of observing the substrate from right above with an optical microscope is b, regarding 10 bonding wires that are bonded, it was determined to be fault and evaluated as "cross" if there was at least one point where a value obtained by dividing b by a (that is, b/a) satisfied $1.02 \leq b/a$, and it was determined to be fine and evaluated as "circle" if there was no point where $1.0 2 \leq b/a$ was satisfied. Evaluation results are indicated in a column of "loop straightness" in Table 1-1, Table 1-2, Table 1-3, Table 1-4, and Table 2-1. "cross" means "failure", and "circle" means "passed".

(Method for Evaluating Shear Force of Wedge Bonded Part)

The following describes a method for evaluating the shear force of the wedge bonded part. The shear force of the wedge bonded part was evaluated by performing wedge bonding at 10 points under typical bonding conditions, and measuring the shear force of the wedge bonded parts. A commercially available micro shear strength tester was used for measuring the shear force. A shear rate was set to be 200 µm/sec, and a height of a shearing tool from the substrate was set to be 10 µm. The shear force was measured while fixing, by a jig, the substrate to which the wire was bonded. It was determined to be failure and evaluated as "cross" if there was at least one point where a value of the shear force obtained by a shear strength test for the wedge bonded part was smaller than 9 N, and it was determined that there was no practical problem and evaluated as "circle" in a case where the shear force obtained by the shear strength test for the wedge bonded part was equal to or larger than 9 N and smaller than 14 N at all of the 10 points. Furthermore, it was determined to be excellent and evaluated as "double circle" in a case where the shear force obtained by the shear strength test for the wedge bonded part was equal to or larger than 14 N at all of the 10 points. Evaluation results are indicated in a column of "shear force of wedge bonded part" in Table 1-1, Table 1-2, Table 1-3, Table 1-4, and Table 2-1. "cross" means "failure". "circle" and "double circle" mean "passed".

The composition, the orientation ratio (%) of the <100> crystal orientation, the tensile strength, and the evaluation results of the bonding wires according to Examples are summarized in Tables 1-1, 1-2, 1-3, and 1-4. The composition and the like of the bonding wires according to Comparative Examples are indicated in Table 2-1.

TABLE 1-1

| | No. | Pd, Pt concentration (mass ppm) | | | Si, Au, Ag concentration (mass ppm) | | | | Fe, Mg concentration (mass ppm) | | | Orientation ratio of <100> crystal orientation [*1] | Tensile strength | High-temperature and high-humidity | Loop straight- | Shear force of wedge |
| | | Pd | Pt | Total | Si | Au | Ag | Total | Fe | Mg | Total | (%) | (MPa) | service life | ness | bonded part |
|---|---|---|---|---|---|---|---|---|---|---|---|---|---|---|---|---|
| Ex-ample | 1 | 3 | — | 3 | — | — | — | 0 | — | — | 0 | 33 | 28 | ○ | ○ | ○ |
| | 2 | 496 | — | 496 | — | — | — | 0 | — | — | 0 | 31 | 83 | ○ | ○ | ○ |
| | 3 | 3 | — | 3 | — | — | — | 0 | — | — | 0 | 88 | 27 | ○ | ○ | ○ |
| | 4 | 492 | — | 492 | — | — | — | 0 | — | — | 0 | 87 | 82 | ○ | ○ | ○ |
| | 5 | 10 | — | 10 | — | — | — | 0 | — | — | 0 | 67 | 38 | ○ | ○ | ○ |
| | 6 | 20 | — | 20 | — | — | — | 0 | — | — | 0 | 66 | 39 | ○ | ○ | ○ |
| | 7 | 31 | — | 31 | — | — | — | 0 | — | — | 0 | 60 | 42 | ○ | ○ | ○ |
| | 8 | 50 | — | 50 | — | — | — | 0 | — | — | 0 | 63 | 44 | ○ | ○ | ○ |
| | 9 | 100 | — | 100 | — | — | — | 0 | — | — | 0 | 55 | 50 | ○ | ○ | ○ |
| | 10 | 302 | — | 302 | — | — | — | 0 | — | — | 0 | 42 | 80 | ○ | ○ | ○ |
| | 11 | — | 3 | 3 | — | — | — | 0 | — | — | 0 | 34 | 26 | ○ | ○ | ○ |
| | 12 | — | 494 | 494 | — | — | — | 0 | — | — | 0 | 32 | 85 | ○ | ○ | ○ |
| | 13 | — | 3 | 3 | — | — | — | 0 | — | — | 0 | 88 | 28 | ○ | ○ | ○ |
| | 14 | — | 495 | 495 | — | — | — | 0 | — | — | 0 | 85 | 81 | ○ | ○ | ○ |
| | 15 | — | 50 | 50 | — | — | — | 0 | — | — | 0 | 65 | 37 | ○ | ○ | ○ |
| | 16 | — | 71 | 71 | — | — | — | 0 | — | — | 0 | 59 | 46 | ○ | ○ | ○ |
| | 17 | — | 100 | 100 | — | — | — | 0 | — | — | 0 | 56 | 52 | ○ | ○ | ○ |
| | 18 | — | 150 | 150 | — | — | — | 0 | — | — | 0 | 51 | 63 | ○ | ○ | ○ |
| | 19 | — | 300 | 300 | — | — | — | 0 | — | — | 0 | 41 | 81 | ○ | ○ | ○ |
| | 20 | 10 | 30 | 40 | — | — | — | 0 | — | — | 0 | 57 | 33 | ○ | ○ | ○ |
| | 21 | 11 | 40 | 51 | — | — | — | 0 | — | — | 0 | 72 | 36 | ○ | ○ | ○ |
| | 22 | 10 | 72 | 82 | — | — | — | 0 | — | — | 0 | 65 | 42 | ○ | ○ | ○ |
| | 23 | 20 | 30 | 50 | — | — | — | 0 | — | — | 0 | 57 | 38 | ○ | ○ | ○ |
| | 24 | 20 | 50 | 70 | — | — | — | 0 | — | — | 0 | 68 | 39 | ○ | ○ | ○ |
| | 25 | 20 | 100 | 120 | — | — | — | 0 | — | — | 0 | 60 | 48 | ○ | ○ | ○ |
| | 26 | 40 | 20 | 60 | — | — | — | 0 | — | — | 0 | 72 | 44 | ○ | ○ | ○ |
| | 27 | 40 | 50 | 90 | — | — | — | 0 | — | — | 0 | 67 | 53 | ○ | ○ | ○ |
| | 28 | 51 | 50 | 101 | — | — | — | 0 | — | — | 0 | 63 | 60 | ○ | ○ | ○ |
| | 29 | 50 | 99 | 149 | — | — | — | 0 | — | — | 0 | 59 | 70 | ○ | ○ | ○ |
| | 30 | 100 | 101 | 201 | — | — | — | 0 | — | — | 0 | 52 | 74 | ○ | ○ | ○ |

[*1] As a result of measuring crystal orientation on cross-section parallel to wire axis direction including wire axis of bonding wire, orientation ratio of <100> crystal orientation angled at 15 degrees or less to wire axis direction (%)

TABLE 1-2

| | No. | Pd, Pt concentration (mass ppm) | | | Si, Au, Ag concentration (mass ppm) | | | | Fe, Mg concentration (mass ppm) | | | Orientation ratio of <100> crystal orientation [*1] | Tensile strength | High-temperature and high-humidity | Loop straight- | Shear force of wedge |
| | | Pd | Pt | Total | Si | Au | Ag | Total | Fe | Mg | Total | (%) | (MPa) | service life | ness | bonded part |
|---|---|---|---|---|---|---|---|---|---|---|---|---|---|---|---|---|
| Ex-ample | 31 | 24 | — | 24 | — | — | — | 0 | — | — | 0 | 64 | 26 | ○ | ○ | ○ |
| | 32 | 50 | — | 50 | — | — | — | 0 | — | — | 0 | 52 | 84 | ○ | ○ | ○ |
| | 33 | — | 71 | 71 | — | — | — | 0 | — | — | 0 | 65 | 35 | ○ | ○ | ○ |
| | 34 | — | 103 | 103 | — | — | — | 0 | — | — | 0 | 51 | 82 | ○ | ○ | ○ |
| | 35 | 10 | 32 | 42 | — | — | — | 0 | — | — | 0 | 62 | 35 | ○ | ○ | ○ |
| | 36 | 20 | 50 | 70 | — | — | — | 0 | — | — | 0 | 58 | 40 | ○ | ○ | ○ |
| | 37 | 12 | 60 | 72 | — | — | — | 0 | — | — | 0 | 55 | 81 | ○ | ○ | ○ |
| | 38 | 30 | 40 | 70 | — | — | — | 0 | — | — | 0 | 52 | 83 | ○ | ○ | ○ |

TABLE 1-2-continued

| | Pd, Pt concentration (mass ppm) | | | Si, Au, Ag concentration (mass ppm) | | | | Fe, Mg concentration (mass ppm) | | | Orientation ratio of <100> crystal orientation [*1] | Tensile strength | High-temperature and high-humidity | Loop straight- | Shear force of wedge |
|---|---|---|---|---|---|---|---|---|---|---|---|---|---|---|---|
| No. | Pd | Pt | Total | Si | Au | Ag | Total | Fe | Mg | Total | (%) | (MPa) | service life | ness | bonded part |
| 39 | 20 | — | 20 | — | — | — | 0 | — | — | 0 | 67 | 23 | ○ | X | ○ |
| 40 | — | 63 | 63 | — | — | — | 0 | — | — | 0 | 65 | 24 | ○ | X | ○ |
| 41 | 50 | — | 50 | — | — | — | 0 | — | — | 0 | 63 | 21 | ○ | X | ○ |
| 42 | — | 100 | 100 | — | — | — | 0 | — | — | 0 | 60 | 22 | ○ | X | ○ |
| 43 | 10 | 30 | 40 | — | — | — | 0 | — | — | 0 | 75 | 24 | ○ | X | ○ |
| 44 | 15 | 50 | 65 | — | — | — | 0 | — | — | 0 | 71 | 20 | ○ | X | ○ |

[*1] As a result of measuring crystal orientation on cross-section parallel to wire axis direction including wire axis of bonding wire, orientation ratio of <100> crystal orientation angled at 15 degrees or less to wire axis direction (%)

15

TABLE 1-3

| | | Pd, Pt concentration (mass ppm) | | | Si, Au, Ag concentration (mass ppm) | | | | Fe, Mg concentration (mass ppm) | | | Orientation ratio of <100> crystal orientation [*1] | Tensile strength | High-temperature and high-humidity | Loop straight- | Shear force of wedge |
|---|---|---|---|---|---|---|---|---|---|---|---|---|---|---|---|---|
| | No. | Pd | Pt | Total | Si | Au | Ag | Total | Fe | Mg | Total | (%) | (MPa) | service | ness | bonded part |
| Ex-ample | 45 | 25 | — | 25 | 4 | — | — | 4 | — | — | 0 | 60 | 38 | ◎ | ○ | ○ |
| | 46 | 30 | — | 30 | — | 3 | — | 3 | — | — | 0 | 58 | 37 | ◎ | ○ | ○ |
| | 47 | 29 | — | 29 | — | — | 5 | 5 | — | — | 0 | 55 | 41 | ◎ | ○ | ○ |
| | 48 | — | 72 | 72 | 9900 | — | — | 9900 | — | — | 0 | 44 | 75 | ◎ | ○ | ○ |
| | 49 | — | 80 | 80 | — | 9900 | — | 9900 | — | — | 0 | 42 | 77 | ◎ | ○ | ○ |
| | 50 | — | 81 | 81 | — | — | 9900 | 9900 | — | — | 0 | 46 | 78 | ◎ | ○ | ○ |
| | 51 | 14 | — | 14 | 50 | — | — | 50 | — | — | 0 | 60 | 40 | ◎ | ○ | ○ |
| | 52 | 18 | — | 18 | 500 | — | — | 500 | — | — | 0 | 57 | 45 | ◎ | ○ | ○ |
| | 53 | 12 | — | 12 | 1000 | — | — | 1000 | — | — | 0 | 66 | 56 | ◎ | ○ | ○ |
| | 54 | 10 | — | 10 | 5001 | — | — | 5001 | — | — | 0 | 35 | 81 | ◎ | ○ | ○ |
| | 55 | 25 | — | 25 | 52 | — | — | 52 | — | — | 0 | 38 | 40 | ◎ | ○ | ○ |
| | 56 | 24 | — | 24 | 1000 | — | — | 1000 | — | — | 0 | 52 | 55 | ◎ | ○ | ○ |
| | 57 | 50 | — | 50 | 503 | — | — | 503 | — | — | 0 | 82 | 40 | ◎ | ○ | ○ |
| | 58 | — | 70 | 70 | 600 | — | — | 600 | — | — | 0 | 62 | 46 | ◎ | ○ | ○ |
| | 59 | — | 100 | 100 | 1000 | — | — | 1000 | — | — | 0 | 61 | 51 | ◎ | ○ | ○ |
| | 60 | 20 | 30 | 50 | 500 | — | — | 500 | — | — | 0 | 59 | 44 | ◎ | ○ | ○ |
| | 61 | 50 | — | 50 | — | 102 | — | 102 | — | — | 0 | 60 | 49 | ◎ | ○ | ○ |
| | 62 | — | 63 | 63 | — | — | 100 | 100 | — | — | 0 | 62 | 43 | ◎ | ○ | ○ |
| | 63 | — | 100 | 100 | — | 500 | — | 500 | — | — | 0 | 57 | 52 | ◎ | ○ | ○ |
| | 64 | — | 150 | 150 | — | — | 503 | 503 | — | — | 0 | 50 | 59 | ◎ | ○ | ○ |
| | 65 | 50 | — | 50 | 1 | — | — | 1 | — | — | 0 | 62 | 43 | ○ | ○ | ○ |
| | 66 | — | 71 | 71 | — | 1 | — | 1 | — | — | 0 | 63 | 41 | ○ | ○ | ○ |
| | 67 | 30 | — | 30 | — | — | 2 | 2 | — | — | 0 | 54 | 50 | ○ | ○ | ○ |
| | 68 | — | 103 | 103 | 1 | 1 | — | 2 | — | — | 0 | 50 | 64 | ○ | ○ | ○ |
| | 69 | 20 | — | 20 | — | 1 | 1 | 2 | — | — | 0 | 59 | 45 | ○ | ○ | ○ |
| | 70 | — | 50 | 50 | 1 | — | 1 | 2 | — | — | 0 | 63 | 51 | ○ | ○ | ○ |
| | 71 | 20 | 50 | 70 | 2 | — | — | 2 | — | — | 0 | 58 | 60 | ○ | ○ | ○ |
| | 72 | 20 | 20 | 40 | — | 1 | — | 1 | — | — | 0 | 60 | 53 | ○ | ○ | ○ |
| | 73 | 10 | 30 | 40 | — | — | 2 | 2 | — | — | 0 | 64 | 47 | ○ | ○ | ○ |

[*1] As a result of measuring crystal orientation on cross-section parallel to wire axis direction including wire axis of bonding wire, orientation ratio of <100> crystal orientation angled at 15 degrees or less to wire axis direction (%)

TABLE 1-4

| | | Pd, Pt concentration (mass ppm) | | | Si, Au, Ag concentration (mass ppm) | | | | Fe, Mg concentration (mass ppm) | | | Orientation ratio of <100> crystal orientation [*1] | Tensile strength | High-temperature and high-humidity | Loop straight- | Shear force of wedge |
|---|---|---|---|---|---|---|---|---|---|---|---|---|---|---|---|---|
| | No. | Pd | Pt | Total | Si | Au | Ag | Total | Fe | Mg | Total | (%) | (MPa) | service | ness | bonded part |
| Ex-ample | 74 | 19 | — | 19 | 501 | — | — | 501 | 3 | — | 3 | 56 | 40 | ◎ | ○ | ◎ |
| | 75 | 30 | — | 30 | 510 | — | — | 510 | — | 4 | 4 | 51 | 44 | ◎ | ○ | ◎ |
| | 76 | 30 | — | 30 | 916 | — | — | 916 | 698 | — | 698 | 40 | 77 | ◎ | ○ | ◎ |
| | 77 | 52 | — | 52 | 960 | — | — | 960 | — | 695 | 695 | 38 | 79 | ◎ | ○ | ◎ |
| | 78 | 50 | — | 50 | — | 51 | — | 51 | 51 | — | 51 | 62 | 49 | ◎ | ○ | ◎ |
| | 79 | 71 | — | 71 | — | — | 60 | 60 | — | 50 | 50 | 68 | 43 | ◎ | ○ | ◎ |
| | 80 | — | 51 | 51 | 500 | — | — | 500 | 202 | — | 202 | 59 | 54 | ◎ | ○ | ◎ |
| | 81 | — | 70 | 70 | 972 | — | — | 972 | — | 200 | 200 | 52 | 60 | ◎ | ○ | ◎ |
| | 82 | — | 103 | 103 | 502 | — | — | 502 | — | 400 | 400 | 50 | 67 | ◎ | ○ | ◎ |

TABLE 1-4-continued

| No. | Pd, Pt concentration (mass ppm) | | | Si, Au, Ag concentration (mass ppm) | | | | Fe, Mg concentration (mass ppm) | | | Orientation ratio of <100> crystal orientation *1 (%) | Tensile strength (MPa) | High-temperature and high-humidity service | Loop straightness | Shear force of wedge bonded part |
|---|---|---|---|---|---|---|---|---|---|---|---|---|---|---|---|
| | Pd | Pt | Total | Si | Au | Ag | Total | Fe | Mg | Total | | | | | |
| 83 | 20 | — | 20 | 1001 | — | — | 1001 | 50 | 20 | 70 | 66 | 58 | ⊚ | ○ | ⊚ |
| 84 | 50 | — | 50 | 550 | — | — | 550 | 15 | 41 | 56 | 65 | 53 | ⊚ | ○ | ⊚ |
| 85 | 100 | — | 100 | 501 | — | — | 501 | 30 | 30 | 60 | 57 | 50 | ⊚ | ○ | ⊚ |
| 86 | — | 80 | 80 | — | 10 | — | 10 | 30 | — | 30 | 66 | 41 | ⊚ | ○ | ⊚ |
| 87 | — | 120 | 120 | — | — | 15 | 15 | — | 32 | 32 | 59 | 61 | ⊚ | ○ | ⊚ |
| 88 | 10 | 30 | 40 | 510 | — | — | 510 | 50 | — | 50 | 63 | 48 | ⊚ | ○ | ⊚ |
| 89 | 10 | 50 | 60 | 511 | — | — | 511 | — | 50 | 50 | 65 | 55 | ⊚ | ○ | ⊚ |
| 90 | 18 | — | 18 | 505 | — | — | 505 | 2 | — | 2 | 64 | 52 | ⊚ | ○ | ○ |
| 91 | 50 | — | 50 | 988 | — | — | 988 | — | 1 | 1 | 60 | 59 | ⊚ | ○ | ○ |
| 92 | — | 70 | 70 | 560 | — | — | 560 | 1 | — | 1 | 58 | 48 | ⊚ | ○ | ○ |
| 93 | — | 100 | 100 | 950 | — | — | 950 | — | 2 | 2 | 61 | 60 | ⊚ | ○ | ○ |
| 94 | 10 | 30 | 40 | 510 | — | — | 510 | 2 | — | 2 | 67 | 52 | ⊚ | ○ | ○ |
| 95 | 12 | 50 | 62 | 906 | — | — | 906 | — | 2 | 2 | 55 | 62 | ⊚ | ○ | ○ |
| 96 | 10 | 40 | 50 | 550 | — | — | 550 | 1 | 1 | 2 | 59 | 56 | ⊚ | ○ | ○ |

*1 As a result of measuring crystal orientation on cross-section parallel to wire axis direction including wire axis of bonding wire, orientation ratio of <100> crystal orientation angled at 15 degrees or less to wire axis direction (%)

TABLE 2-1

| | No. | Pd, Pt concentration (mass ppm) | | | Si, Au, Ag concentration (mass ppm) | | | | Fe, Mg concentration (mass ppm) | | | Orientation ratio of <100> crystal orientation *1 (%) | Tensile strength (MPa) | High-temperature and high-humidity service | Loop straightness | Shear force of wedge bonded part |
|---|---|---|---|---|---|---|---|---|---|---|---|---|---|---|---|---|
| | | Pd | Pt | Total | Si | Au | Ag | Total | Fe | Mg | Total | | | | | |
| Comparative Example | 1 | 2 | — | 2 | — | — | — | 0 | — | — | 0 | 28 | 76 | X | X | X |
| | 2 | 1 | — | 1 | — | — | — | 0 | — | — | 0 | 91 | 22 | X | X | X |
| | 3 | — | 1 | 1 | — | — | — | 0 | — | — | 0 | 29 | 74 | X | X | X |
| | 4 | — | 2 | 2 | — | — | — | 0 | — | — | 0 | 95 | 23 | X | X | X |
| | 5 | 1 | 1 | 2 | — | — | — | 0 | — | — | 0 | 26 | 75 | X | X | X |
| | 6 | 1 | 1 | 2 | — | — | — | 0 | — | — | 0 | 92 | 21 | X | X | X |
| | 7 | 33 | — | 33 | — | — | — | 0 | — | — | 0 | 25 | 86 | X | X | X |
| | 8 | 60 | — | 60 | — | — | — | 0 | — | — | 0 | 24 | 88 | X | X | X |
| | 9 | 108 | — | 108 | — | — | — | 0 | — | — | 0 | 28 | 91 | X | X | X |
| | 10 | — | 80 | 80 | — | — | — | 0 | — | — | 0 | 27 | 87 | X | X | X |
| | 11 | 11 | 31 | 42 | — | — | — | 0 | — | — | 0 | 26 | 86 | X | X | X |
| | 12 | 1 | 1 | 2 | — | — | — | 0 | — | — | 0 | 66 | 40 | X | X | X |

*1 As a result of measuring crystal orientation on cross-section parallel to wire axis direction including wire axis of bonding wire, orientation ratio of <100> crystal orientation angled at 15 degrees or less to wire axis direction (%)

It is confirmed that all of the bonding wires in Examples No. 1 to 96 contain equal to or larger than 3 mass ppm and equal to smaller than 500 mass ppm of one or more of Pd and Pt in total, the orientation ratio of the <100> crystal orientation angled at 15 degrees or less to the wire axis direction is equal to or higher than 30% and equal to or lower than 90% on the cross-section parallel with the wire axis direction including the wire axis, and a favorable high-temperature and high-humidity service life is exhibited in a high-temperature and high-humidity environment required for power devices.

Additionally, it is confirmed that the bonding wires according to Examples No. 1 to 38, and 45 to 96 the tensile strength of which is equal to or larger than 25 MPa and equal to or smaller than 85 MPa can obtain excellent loop straightness at the time when a long-span loop is formed.

It is also confirmed that the bonding wires according to Examples No. 45 to 64, and 74 to 96 containing equal to or larger than 3 mass ppm and equal to or smaller than 10000 mass ppm of one or more of Si, Au, and Ag in total can achieve a further favorable high-temperature and high-humidity service life in a high-temperature and high-humidity environment required for the power devices.

Furthermore, it was confirmed that the bonding wires according to Examples No. 74 to 89 containing equal to or larger than 3 mass ppm and equal to or smaller than 700 mass ppm of one or more of Fe and Mg in total are excellent in the shear force of the wedge bonded part.

On the other hand, it was confirmed that, regarding the bonding wires according to Comparative Examples No. 1 to 12, the total concentration of one or more of Pd and Pt and the orientation ratio of the <100> crystal orientation are outside the range of the present invention, and corrosion proceeds in a high-temperature and high-humidity environment required for power devices, so that a sufficient high-temperature and high-humidity service life cannot be obtained.

The invention claimed is:

1. An Al bonding wire for semiconductor devices containing equal to or larger than 3 mass ppm and equal to or smaller than 500 mass ppm of one or more of Pd and Pt in total, wherein, as a result of measuring a crystal orientation on a cross-section parallel to a wire axis direction including a wire axis of the bonding wire, an orientation ratio of a <100> crystal orientation angled at 15 degrees or less to the wire axis direction is equal to or higher than 30% and equal to or lower than 90%.

2. The Al bonding wire for semiconductor devices according to claim 1, wherein a tensile strength is equal to or larger than 25 MPa and equal to or smaller than 85 MPa.

3. The Al bonding wire for semiconductor devices according to claim 1, further containing equal to or larger than 3 mass ppm and equal to or smaller than 10000 mass ppm of one or more of Si, Au, and Ag in total.

4. The Al bonding wire for semiconductor devices according to claim 1, further containing equal to or larger than 3 mass ppm and equal to or smaller than 700 mass ppm of one or more of Fe and Mg in total.

5. The Al bonding wire for semiconductor devices according to claim 1, wherein a content of Al is equal to or larger than 98% by mass.

6. The Al bonding wire for semiconductor devices according to claim 1, wherein a balance of the Al bonding wire comprises Al and inevitable impurities.

7. A semiconductor device comprising the Al bonding wire for semiconductor devices according to claim 1.

8. The Al bonding wire for semiconductor devices according to claim 1, wherein the Al bonding wire contains both Pd and Pt, and a total amount of Pd and Pt in the Al bonding wire is equal to or larger than 3 mass ppm and equal to or smaller than 500 mass ppm.

9. The Al bonding wire for semiconductor devices according to claim 3, wherein the Al bonding wire contains at least Au.

\* \* \* \* \*